United States Patent
Mateman

(10) Patent No.: US 10,340,928 B2
(45) Date of Patent: Jul. 2, 2019

(54) PHASE-LOCKED LOOP

(71) Applicant: Stichting IMEC Nederland, Eindhoven (NL)

(72) Inventor: Paul Mateman, Millingen a/d Rijn (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/985,563

(22) Filed: May 21, 2018

(65) Prior Publication Data
US 2018/0337683 A1    Nov. 22, 2018

(30) Foreign Application Priority Data
May 22, 2017   (EP) ..................... 17172233

(51) Int. Cl.
*H03D 3/24*    (2006.01)
*H03L 7/099*   (2006.01)
(Continued)

(52) U.S. Cl.
CPC ............ *H03L 7/0992* (2013.01); *H03L 7/081* (2013.01); *H03L 7/091* (2013.01); *H03L 7/18* (2013.01); *H04L 7/0331* (2013.01); *H04L 1/205* (2013.01)

(58) Field of Classification Search
CPC ... H03L 7/09992; H03L 7/091; H04L 7/0331; H04L 1/205
(Continued)

(56) References Cited

U.S. PATENT DOCUMENTS 9,362,936 B1 *   6/2016  Caffee ................ H03K 5/135
9,853,807 B2 *  12/2017  Tsai .................... H03L 7/0994
(Continued)

FOREIGN PATENT DOCUMENTS

DE    10 2013 113 495 A1    6/2015

OTHER PUBLICATIONS

Pavlovic, Nenad et al., "A 5.3GHz Digital-to-Time-Converter-Based Fractional-N All-Digital PLL", ISSCC 2011 / Session 3 / RF Techniques / 3.2, 2011 IEEE International Solid-State Circuits Conference, 2011, 3 pages.
(Continued)

*Primary Examiner* — Helene E Tayong
(74) *Attorney, Agent, or Firm* — McDonnell Boehnen Hulbert & Berghoff LLP

(57) ABSTRACT

Systems and methods for providing improved linearity and reduced noise in a digital phase-locked loop in which a differential time-to-digital converter is implemented. Digital-to-time converters are used for adjusting a reference clock signal based on a fractional change signal and for adjusting a feedback signal based on another fractional change signal. Each fractional change signal is centered about a midpoint, M, and offset from the midpoint by a fraction, x, such that the fractional change signals can be described as (M+x) and (M−x), respectively. By implementing a differential time-to-digital converter, the sum of delays in each input path is kept constant so that integral non-linearity is improved. Supply sensitivity is also reduced, as the same supply is applied to both differential input paths. Since the differential delay can be both positive and negative, the delay range of a differential digital-to-time converter is half that of a single input digital-to-time converter.

18 Claims, 7 Drawing Sheets

(51) Int. Cl.
*H04L 7/033* (2006.01)
*H03L 7/091* (2006.01)
*H03L 7/081* (2006.01)
*H03L 7/18* (2006.01)
*H04L 1/20* (2006.01)

(58) Field of Classification Search
USPC .......................................................... 375/376
See application file for complete search history.

(56) References Cited

U.S. PATENT DOCUMENTS

| | | | | |
|---|---|---|---|---|
| 2002/0191727 | A1* | 12/2002 | Staszewski | H03C 3/0966 375/376 |
| 2005/0271162 | A1 | 12/2005 | Goth et al. | |
| 2008/0238652 | A1* | 10/2008 | Henzler | G04F 10/06 340/527 |
| 2012/0081158 | A1* | 4/2012 | Mateman | H03L 7/091 327/156 |
| 2017/0373698 | A1* | 12/2017 | Yan | G04F 10/005 |
| 2019/0068205 | A1* | 2/2019 | Tamura | H03L 7/08 |

OTHER PUBLICATIONS

European Search Report, European Patent Application No. 17172233.3, dated Dec. 1, 2017, 7 pages.
Chen, Mike Shuo-Wei, "Overhead Minimization Techniques for Digital Phase-Locked Loop Frequency Synthesizer", 2012 IEEE 55th International Midwest Symposium on Circuits and Systems, Aug. 5, 2012, pp. 682-685.
Narayanan, Aravind Tharayil et al., "A Fractional-N Sub-Sampling PLL Using a Pipelined Phase-Interpolator With a FoM of -246dB", 2013 Proceedings of the ESSCIRC, Sep. 14, 2015, pp. 380-383.
Vo, Tuan Minh et al., "Analysis of Fractional-N Bang-Bang Digital PLLs Using Phase Switching Technique", 2016 12th Conference on Ph.D. Research in Microelectronics and Electronics (PRIME), Jun. 27, 2016, pp. 1-4.
Levantino, Salvatore et al., "An Adaptive Pre-Distortion Technique to Mitigate the DTC Nonlinearity in Digital PLLS", IEEE Journal of Solid-State Circuits, vol. 49, No. 8, Aug. 1, 2014, pp. 1762-1772.
Staszewski, Robert Bogdan et al., "1.3 V 20 ps Time-to-Digital Converter for Frequency Synthesis in 90-nm CMOS", IEEE Transactions on Circuits and Systems—II: Express Briefs, vol. 53, No. 3, Mar. 2006, pp. 220-224.
Chang, Wei-Sung et al., "A 5 GHz Fractional-N ADC-Based Digital Phase-Locked Loops With -243.8 dB FOM", IEEE Transactions on Circuits and Systems—1: Regular Papers, vol. 63, No. 11, Nov. 2016, pp. 1845-1853.
Kim, Deok-Soo et al., "A 0.3-1.4 GHz All-Digital Fractional-N PLL With Adaptive Loop Gain Controller", IEEE Journal of Solid-State Circuits, vol. 45, No. 11, Nov. 2010, pp. 2300-2311.
Zhuang, Jingcheng et al., "All-Digital RF Phase-Locked Loops Exploiting Phase Prediction", IPSJ Transactions on System LSI Design Methodology, vol. 7, Feb. 2014, pp. 2-15.
Chillara, Vamshi Krishna et al., "An 860uW 2.1-to-2.7GHz All-Digital PLL-Based Frequency Modulator With a DTC-Assisted Snapshot TDC for WPAN (Bluetooth Smart and ZigBee) Applications", ISSCC 2014, Session 9, Low-Power Wireless, 9.8, pp. 172-173 and Figure 9.8.7.

\* cited by examiner

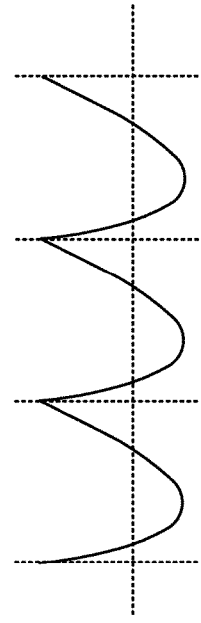
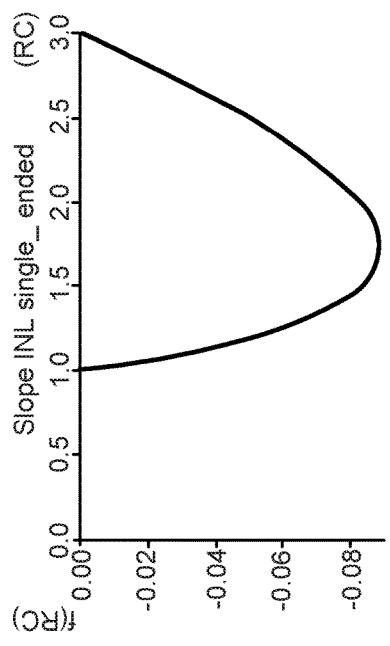
*Fig. 6a*
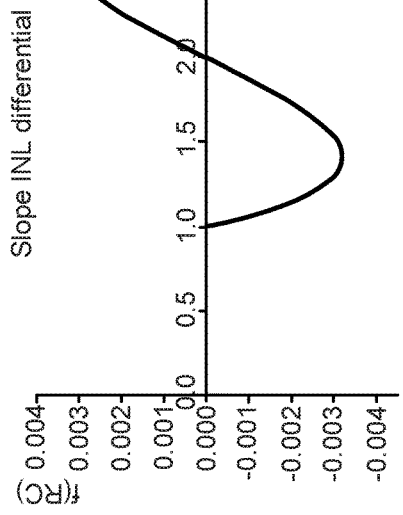
*Fig. 6b*

PHASE-LOCKED LOOP

CROSS-REFERENCE TO RELATED APPLICATION

The present application is a non-provisional patent application claiming priority to European Patent Application No. 17172233.3 filed May 22, 2017, the contents of which are hereby incorporated by reference.

TECHNICAL FIELD

The present disclosure relates to phase-locked loops, including digital phase-locked loops having a differential input.

BACKGROUND

Recently, digital phase-locked loops (DPLLs) have gained a lot of popularity, and may provide a number of benefits over their analog counterparts, for instance in deep-submicron technologies. Digital-to-time converters (DTCs) can be used in DPLLs to compensate for the limited range of time-to-digital converters (TDCs) which can form part of the DPLL. In some implementations, integer multiples of a reference frequency can be synthesized, while in other implementations, non-integer multiples of the reference frequency can be synthesized.

A TDC can be implemented as a chain of flip-flops, which all sample a slightly delayed version of an input signal, each flip-flop comprising a tap or a section of a tapped delay line. Delays can be in the 10 ps range in order to minimize the quantization noise, and, can cause the chain to be very long (of the order of hundreds of ps) in order to cover one high-frequency clock period. When the DPLL is locked, edge positions of the high-frequency clock (often referred to as a digital crystal oscillator or "DCO") period can be predicted very accurately, resulting in a minimal variation around these edge positions. However, in practice, the length of the chain of flip-flops forming the TDC can be limited to a few taps or sections, for example 16 taps, and the DTC can be implemented to delay the reference edge to the middle of the TDC. However, the design of the DTC for such applications can be challenging as the output may need to be very linear with low noise in order to provide a reference path through the DPLL.

In an article entitled "1.3V 20 ps Time-to-Digital Converter for Frequency Synthesis in 90-nm CMOS" by Robert Bogdan Staszewski et al., IEEE TRANSACTIONS ON CIRCUITS AND SYSTEMS—II: EXPRESS BRIEFS, Vol. 53, No. 3, March 2006, a "pseudodifferential TDC architecture" is described which can be used in all-digital fractional-N PLLs. A TDC core is implemented as a phase/frequency detector and charge pump replacement in all-digital PLL (ADPLL) and is based on a pseudodifferential digital architecture that is insensitive to nMOS and pMOS transistor mismatches.

A DTC-based fractional-N ADPLL is described in an article by Nenad Pavlovic & Jos Bergervoet, ISSCC2011, Session 3, RF Techniques, 3.2, 2011 IEEE International Solid-State Circuits Conference, ISBN: 978-1-61284-302-5/11. The DTC-based ADPLL has a control loop that updates the DCO frequency so that the DCO phase, measured by counting the DCO clock edge transitions, follows the reference phase produced by accumulating the frequency control word on each reference clock cycle. The DTC is added to lower the quantization noise in the fractional-N mode and is implemented by a digitally-controlled delay line.

While DTC implementations can be capacitor based with switched capacitors controlling the delay, linearity and noise are factors that can affect the efficiency of such implementations.

SUMMARY OF THE DISCLOSURE

Disclosed herein are examples of digital-to-time converters in which linearity is improved and noise is reduced.

Disclosed herein are examples of fractional-N phase-locked loops including differential digital-to-time converter implementations.

In accordance with one aspect of the present disclosure, a method of providing a high-frequency clock signal includes (i) generating a reference clock signal in a first clock module; (ii) adjusting the reference clock signal, in a first digital-to-time converter, in accordance with a first control signal and generating a first input signal corresponding to the adjusted reference clock signal; (iii) receiving the first input signal at a time-to-digital converter and generating an output signal based thereon; (iv) generating an output high-frequency clock signal based on the adjusted reference clock output signal; and (v) generating a derived signal from the output high-frequency clock signal.

In some embodiments, the method further includes generating a second control signal, the first and second control signals being centered about a midpoint, M, and being adjusted by a fraction, x, and respectively comprising (M+x) and (M−x) signals.

In some embodiments, the method further includes receiving the second control signal at a second digital-to-time converter and using the second control signal to update the derived signal, the updated derived signal forming a second input for the time-to-digital converter.

By using a differential DTC formed by delay lines corresponding to the first and second DTCs and keeping the sum of the delays in the two delay lines corresponding to the first and second DTCs constant, INL can be improved. In addition, supply sensitivity can be reduced, as the same supply is applied to both delay lines of the differential DTC and supply induced delay variation is effectively canceled.

Moreover, since the differential delay can be both positive and negative, the required delay range of each of the first and second DTCs is half that of a single input DTC, and, because the same total number of capacitors can be used for implementing the differential DTC, the increase in area overhead may be negligibly small.

In some embodiments, the derived signal includes a feedback signal in a phase-locked loop architecture.

In some embodiments, a third control signal can be used for generating the feedback signal.

In some embodiments, the method further includes filtering the output signal from the time-to-digital converter to generate a filtered output signal, which can be used to generate a signal on which the output high-frequency clock signal is based.

In some embodiments, the derived signal includes a phase selector output signal in a phase selector architecture.

In some embodiments, the derived signal includes a sub-sampled output signal in a sub-sampler architecture.

In accordance with another aspect of the present disclosure, an architecture configured for providing a high-frequency output signal includes (i) a first clock module configured for generating a reference clock signal; (ii) a first digital-to-time converter configured for adjusting the reference clock signal in accordance with a first signal and for generating an adjusted reference clock output signal; (iii) a time-to-digital converter configured for receiving a first input signal, the first input signal being the adjusted reference clock output signal from the first digital-to-time converter; (iv) a second clock module configured for receiving the adjusted reference clock output signal from the first digital-to-time converter and for generating an output high-frequency clock signal; (v) means configured for receiving the output high-frequency clock signal and for generating a derived signal forming a second input for the time-to-digital converter; and (vi) a control module configured for generating at least the first control signal.

In some embodiments, the control module can be further configured for generating a second control signal, the first and second control signals being centered about a midpoint, M, and being adjusted by a fraction, x, and respectively comprising (M+x) and (M−x) signals.

In some embodiments, the architecture can further include a second digital-to-time converter configured for updating the derived signal for the time-to-digital converter.

In some embodiments, the architecture can further include at least one filter configured for filtering the output from the time-to-digital converter and for generating a filtered output signal as input for the second clock module.

In some embodiments, the means for generating the derived signal includes a phase selector, the phase selector including a multi-phase divider configured for selecting a phase signal as the input to the second digital-to-time converter, and the second control signal adjusting the selected phase signal in the second digital-to-time converter.

In some embodiments, the means for generating the derived signal includes a sub-sampler, the sub-sampler including a sampler configured for receiving both the reference signal and the output high-frequency clock signal and for generating a sampled signal, the sampled signal forming the input to the second digital-to-time converter, and the second control signal adjusting the sampled signal in the second digital-to-time converter.

In some embodiments, the control module includes a sigma-delta module.

BRIEF DESCRIPTION OF THE DRAWINGS

FIG. 6a illustrates the output from a single-ended digital-to-time converter together with an associated error pattern, according to an example embodiment.

FIG. 6b illustrates the output from a differential digital-to-time converter together with an associated error pattern, according to an example embodiment.

DETAILED DESCRIPTION

Figure 1:
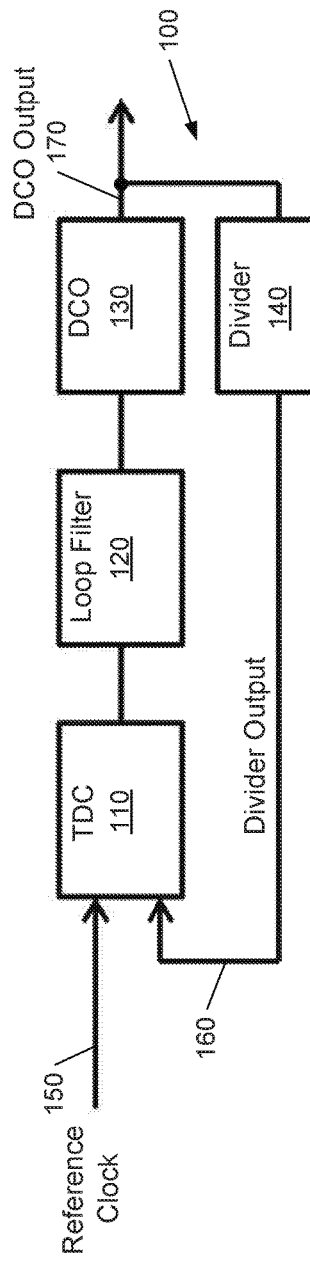
FIG. 1 illustrates a schematic block diagram of an integer-N digital phase-locked loop, according to an example embodiment.

The present disclosure will be described with respect to particular embodiments and with reference to certain drawings, but the disclosure is not limited thereto. The drawings described are only schematic and are non-limiting. In the drawings, the size of some of the elements may be exaggerated and not drawn to scale for illustrative purposes.

The terms "first" and "second" refer to the order in which certain elements are described with reference to the drawings and does not necessarily refer to a temporal order.

The term "PLL" refers to an analog phase-locked loop; the term "DPLL" refers to a phase-locked loop that has a digital control, for example, where either the phase detector or the loop filter is digital (using a digital-to-time converter (DTC) and/or a time-to-digital converter (TDC)); and the term "ADPLL" refers to an all-digital phase-locked loop where the phase detector and the loop filter are implemented in digital form.

The term "integer-N PLL" refers to a PLL where the output frequency is an integer-multiple of an input reference frequency.

The term "fractional-N PLL" refers to a PLL where the ratio, N, between the output frequency and the input reference frequency is a fractional number, that is, a non-integer.

The term "divider N/N+1" as used herein refers to a multimode divider which, at any given moment in time, can divide by either N or by N+1, providing, on average over many cycles, an effective division between N and N+1, that is, a fractional division.

The term "reference frequency" as used herein refers to the frequency provided by a reference crystal oscillator, which can be limited to 125 MHz.

The term "high-frequency" as used herein refers to a frequency that is substantially higher than the reference frequency.

The term "high-frequency clock" as used herein refers to an oscillator that generates high-frequency signals. Such a high-frequency clock can include a digitally controlled oscillator (DCO) or a hybrid implementation with digitally-switched capacitors controlling coarse resolution and a digital-to-analog converter (DAC) controlling fine resolution.

The term "derived signal" refers to a signal output from the high-frequency clock that is used in the feedback loop of a PLL as a second input to a TDC, the first input being that provided from a reference clock signal path. This term also refers to the output signal from a phase selector (the selected phase signal) and the output signal from a sub-sampler (the sampled signal) where the phase selector and sub-sampler receive the high-frequency clock signal as an input thereto as part of a PLL architecture. Similarly, the term "means for generating a derived signal" refers to a feedback loop of a PLL, a phase selector, or a sub-sampler as described below.

FIG. 1 illustrates a schematic block diagram of an integer-N DPLL 100, which includes a TDC 110, a loop filter 120, a high-frequency clock (DCO) 130, and an integer divider (divider N) 140. As shown, the TDC 110 receives a reference clock signal (hereinafter referred to as "reference clock") 150 and an output 160 from the divider N 140. The divider N 140 receives an output signal 170 from the DCO 130 and provides the output signal 160 as part of a feedback loop.

Figure 2:
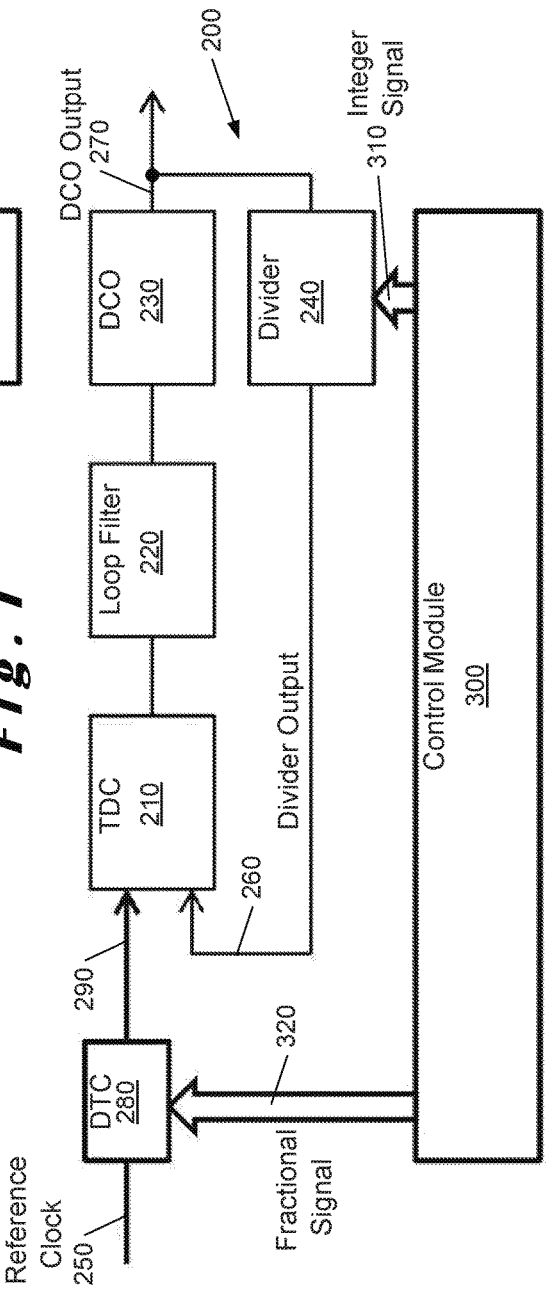
FIG. 2 illustrates a schematic block diagram of a fractional-N/N+1 digital phase-locked loop, according to an example embodiment.

FIG. 2 illustrates a schematic block diagram of a fractional-N DPLL 200. An example of a fractional-N DPLL is disclosed in "All-Digital RF Phase-Locked Loops Exploiting Phase Prediction" by Jingcheng Zhuang et al. (IPSJ Transactions on System LSI Design Methodology, Vol. 7, 2-15, February 2014) where there is disclosure of a divider-based ADPLL mimicking a charge-pump PLL with ΣΔ dithering of the modulus divider, and of an implementation of a DTC in a digital phase error detector. An example of a fractional-N ADPLL is also disclosed in "An 860 μW 2.1-to-2.7 GHz All Digital PLL-Based Frequency Modulator with a DTC-Assisted Snapshot TDC for WPAN (Bluetooth Smart and ZigBee) Applications" by Vamshi Krishna Chillara et al. (ISSCC 2014/Session 9/Low-power wireless/ 9.8, pages 172 to 174).

The fractional-N DPLL 200 includes a TDC 210, a loop filter 220, a DCO 230, and an integer/fractional divider (divider N/N+1) 240. As shown, the divider N/N+1 240 receives an output signal 270 from the DCO 230 and provides an output signal 260 as part of a feedback loop. The TDC 210 receives the output 260 from the divider N/N+1 240 together with a signal from a DTC 280.

The fractional-N DPLL 200 also includes a control module 300, for example, a sigma-delta module, which provides both an integer signal 310 for the divider N/N+1 240 and a fractional signal 320 for the DTC 280. The fractional signal 320 can be used to adjust a reference clock signal 250 applied to the DTC 280.

Figure 3:
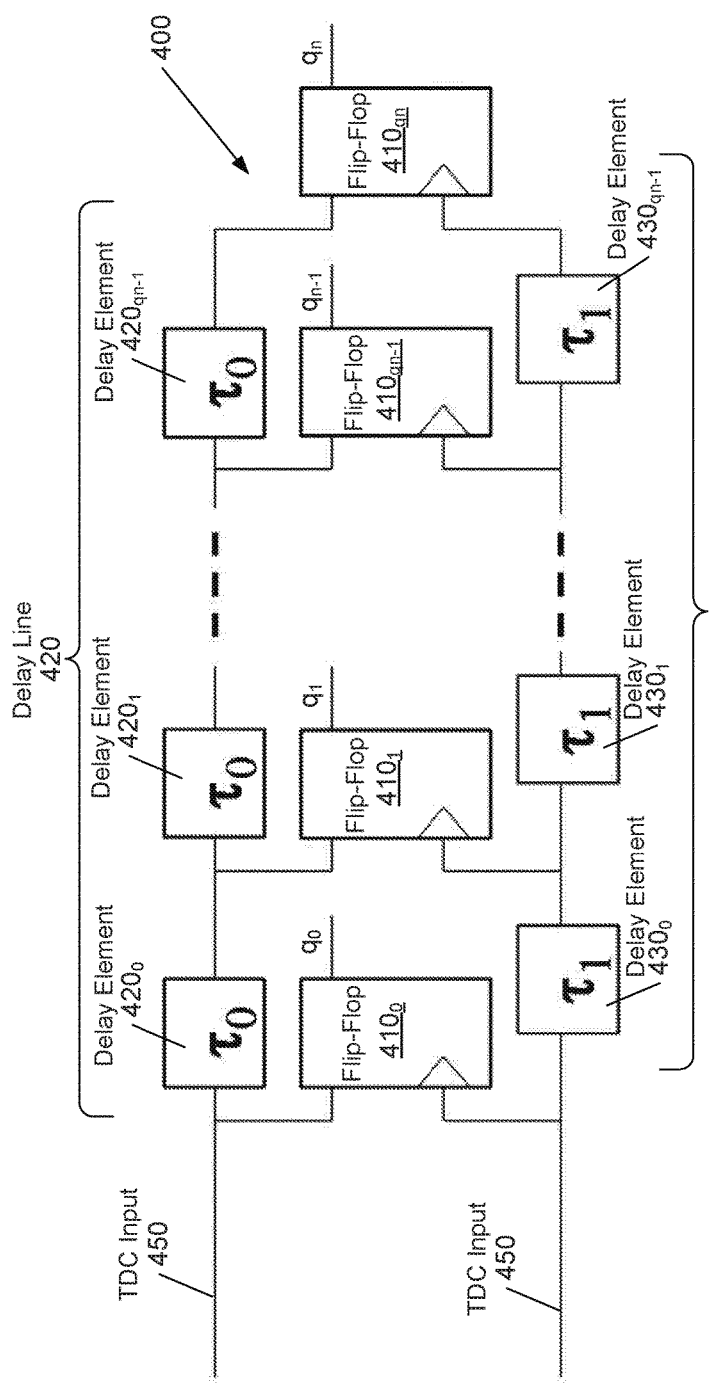
FIG. 3 illustrates a schematic block diagram of a time-to-digital converter, according to an example embodiment.

In FIG. 3, a schematic block diagram of an example TDC 400 is shown, which is implemented using a plurality of flip-flops $410_0$, $410_1$, . . . , $410_{qn-1}$ (referred to generally as "flip-flops 410"), a first plurality of delay elements $420_0$, $420_1$, . . . , $420_{qn-1}$ having a first delay, $\tau_0$, (referred to generally as "delay line 420") and a second plurality of delay elements $430_0$, $430_1$, . . . , $430_{qn-1}$ having a second delay, $\tau_1$ referred to generally as "delay line 430").

As shown, each flip-flop 410 has an associated delay element in each delay line 420, 430, and each delay line 420, 430 provides inputs to the flip-flops 410 as shown. Each flip-flop samples a delayed version of an input signal 450, and, while the delay line 430 is optional in some embodiments, it can be used to partly cancel the first delay to provide a finer resolution in a Vernier structure.

Figure 4:
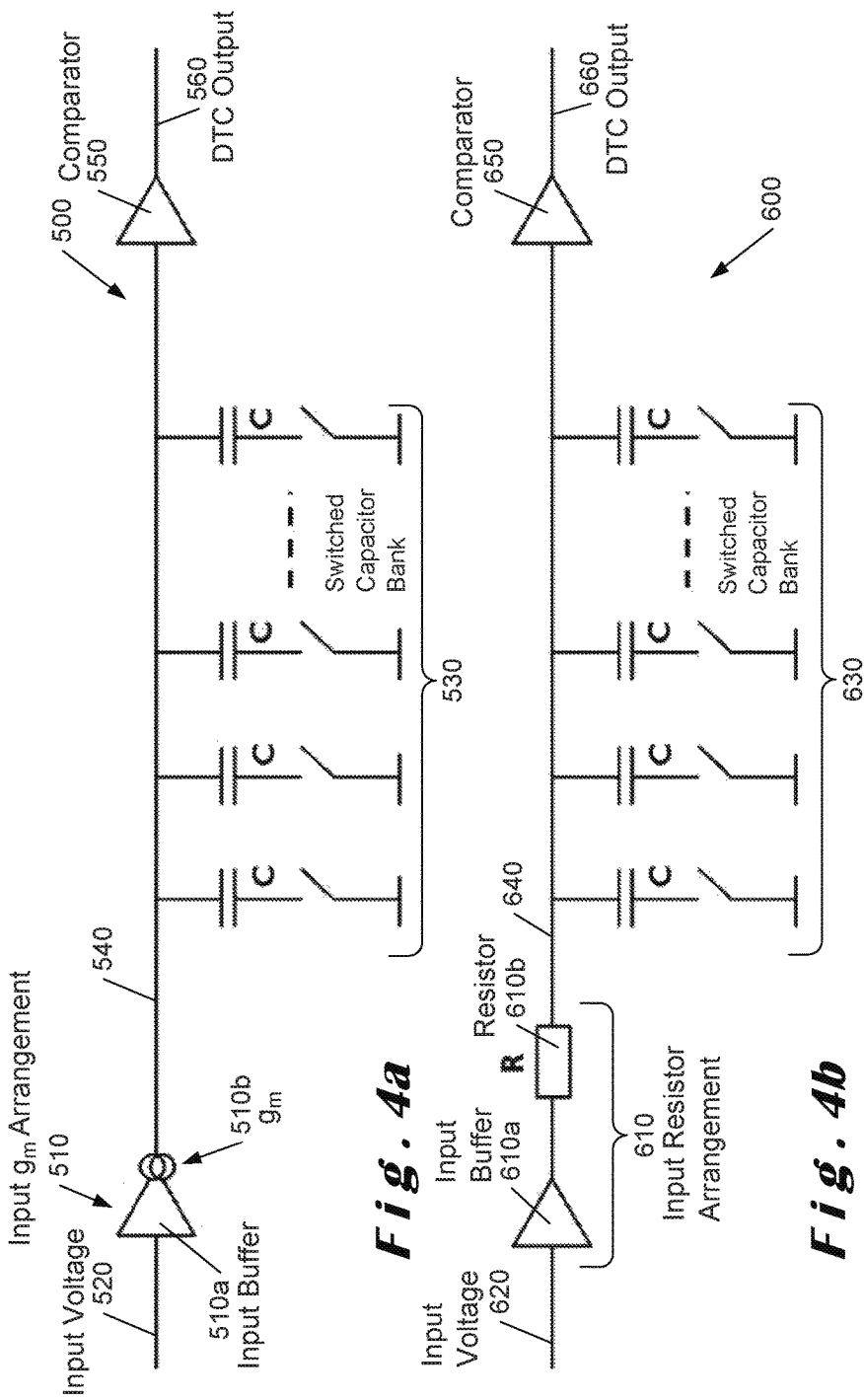
FIGS. 4a and 4b illustrate schematic block diagrams of digital-to-time converters based on gm-C and RC implementations respectively, according to an example embodiment.

Moreover, DTC implementations can use switched capacitors to control delay, either based on gm-C (a voltage-to-current converter/capacitor arrangement) delay or RC (a resistor/capacitor arrangement) delay with the number of capacitors per section of the DTC varying in accordance with a chosen trade-off. FIGS. 4a and 4b illustrate schematic diagrams of gm-C and RC delay implementations respectively.

In FIG. 4a, an example DTC 500 is shown, which includes an input gm arrangement 510 to which an input voltage 520 is applied, a bank of switched capacitors 530 connected to an output 540 from the input gm arrangement 510, and a comparator 550 connected to the bank of switched capacitors 530 to provide an output 560. In this arrangement, the input gm arrangement 510 comprises an input buffer 510a associated with a gm 510b.

In FIG. 4b, another example DTC 600 is shown, which includes an input resistor arrangement 610 to which an input voltage 620 is applied, a bank of switched capacitors 630 connected to an output 640 from the input resistor arrangement 610, and a comparator 650 connected to the bank of switched capacitors 630 to provide an output 660. In this arrangement, the input resistor arrangement 610 includes an input buffer 610a and a resistor 610b.

In both FIGS. 4a and 4b, only one section providing the delay is shown, and, it will readily be appreciated that more than one section may be present. For example, the sections may be cascaded with each section providing a delay contributing to an overall delay for an entire delay line, according to an example implementation.

However, there are two main problems that may arise with existing DTC arrangements, namely, integral non-linearity (hereinafter referred to as "INL") and noise.

INL can arise from the need to match the capacitors. In modern processes, the matching of capacitors may be more readily achieved than the matching of resistors or gm. This tends to favor the use of a configuration with only one section where all capacitors are connected to the same gm or resistor. However, this can still degrade the signal slope, as the DTC may still need to realize a shift of several hundreds of ps. The limited signal slope can increase the impact of noise and introduce non-linearity.

Noise can be caused by the comparator and noise on the comparator reference, such as from the supply (not shown in FIGS. 4a and 4b) in some embodiments. The supply can modulate gm as well as the delay of any input buffers 510a, 610a and the comparators 550, 650. Supply noise may be converted into unwanted delay, such that jitter can become phase noise.

Returning to FIGS. 4a and 4b, the supply may only modulate active components, for example, the input buffers, gm, and the comparators. In practice, the supply's impact on the switches, the resistor, and the capacitors may be negligible, such that the RC implementation shown in FIG. 4b may have less supply-induced delay.

It will readily be understood that the fewer the stages implemented, the smaller the overall delay, as the delay in each stage adds together.

In accordance with the present disclosure, examples of a differential implementation are provided in which only the delay difference between the outputs of first and second DTCs are sampled in the TDC. Supply induced delays may be identical for the buffer, gm, and comparator, assuming that the supply is constant for the duration of a DCO cycle and the supply modulation effect is effectively canceled.

The TDC may form a final phase comparator even if the TDC comprises a single bit, for example, for "bang-bang" operation.

Figure 5:
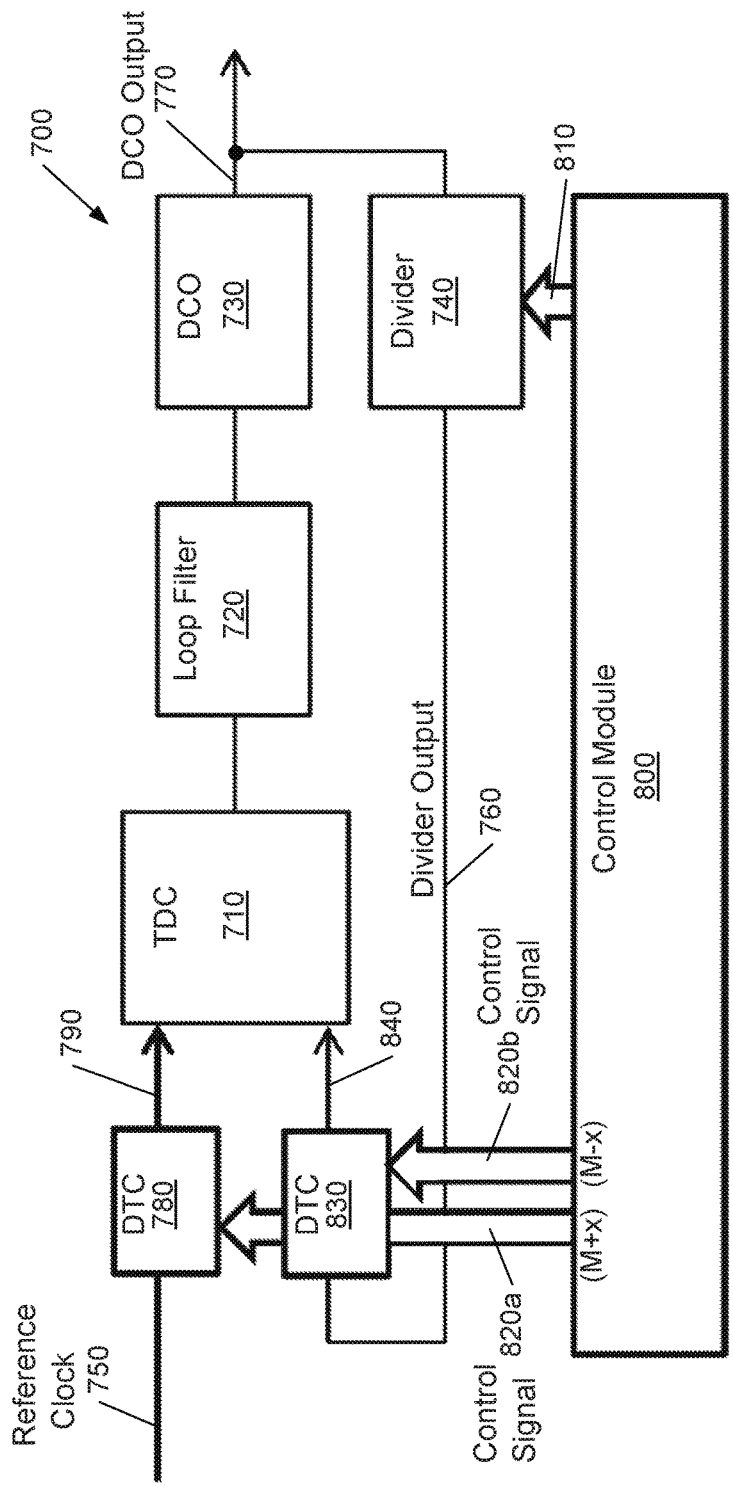
FIG. 5 illustrates a schematic block diagram of a fractional-N/N+1 digital phase-locked loop with a differential digital-to-time converter implementation, according to an example embodiment.

In FIG. 5, a differential PLL 700 is shown, according to an example embodiment. The differential PLL 700 comprises a TDC 710, a loop filter 720, a DCO 730, a divider N/N+1 740, a DTC 780, and a control module 800, each of which may correspond respectively to TDC 210, loop filter 220, DCO 230, divider N/N+1 240, DTC 280, and control module 300 of FIG. 2.

DCO 730 provides an output signal 770, which is fed to the divider N/N+1 740, and the divider N/N+1 provides a feedback signal 760 for input to a second DTC 830. Output from the second DTC 830 forms an output signal 840, which forms a second input to the TDC 710. A reference clock signal 750 is input to the DTC 780, which provides an output signal 790 that forms one input to the TDC 710, the other input to the TDC 710 being output signal 840 from the second DTC 830. Output signal 840 from the second DTC 830 and output signal 790 from the first DTC 780 form the differential input signals for the TDC 710.

Each DTC 780, 830 can include a multi-level DTC, and the TDC 710 can include a multi-bit TDC.

In some embodiments, the second DTC 830 can be configured to delay the feedback signal 760, and, the delay can be set by a control signal 820b from the control module 800. Additionally or alternatively, the first DTC 780 can be configured to delay the reference signal 750, and the delay can be set by a control signal 820a from the control module 800.

As described above, in some embodiments, the fractional output signal can be configured to provide the control signals 820a, 820b. Each control signal 820a, 820b may have a value that is centered around a midpoint M, with one control signal 820a corresponding to (M+x) and the other control signal 820b corresponding to (M−x), where x is the fraction associated with the fractional output signal.

In some embodiments, the control module 800 providing the control signals 820a, 820b may comprise a sigma-delta module as described above with reference to FIG. 2.

The PLL operation drives both the first DTC 780 and second DTC 830 to a position where the two outputs are almost aligned, for example, within a few tens of ps, such that the most sensitive parts of the system see near identical supply conditions. In effect, the PLL operation drives the first and second DTCs 780, 830 in opposite directions so that the outputs therefrom are substantially aligned.

For improved supply (in)sensitivity, an example implementation can include one single stage with RC topology, although this can be less attractive from the point of view of INL. A long delay means that the slope is rather low, and, in combination with the non-ideal comparator input stage, an extra non-linear, slope-dependent delay may result.

To address this INL issue, it is possible to reduce the non-linearity by choosing a differential structure where the sum of the delays in the two delay lines remains constant. For instance, if the signal delay is considered as: $d=a_0+a_1x+a_2x^2+K$, then using −x in the negative delay line causes the even order terms to be canceled.

This cancellation of the even order terms can provide various advantages. For instance, the absolute magnitude of the error can be substantially reduced, and the abrupt change when the fraction wraps around can be reduced together with higher harmonics of the fractional spur. Moreover, when x=0, the equilibrium point, there is no static offset, such that calibration or gain changes have a reduced effect on the PLL operation, for instance, due to less calibration noise.

FIG. 6a illustrates the effects on INL using a single-ended DTC implementation where a repeating error pattern with fractional spur is shown on the right hand side, according to an example embodiment. By way of comparison, in FIG. 6b, the effects on INL using a differential DTC implementation where a repeating error pattern with substantially reduced fractional spurs is shown on the right hand side, according to an example embodiment. As will readily be appreciated, the use of a differential DTC arrangement provides better results.

In some embodiments, the TDC may also operate on a single bit decision like in a "bang-bang" PLL where data is observed with a phase detector with filtering, either early or late, to drive a voltage controlled oscillator. Due to the differential DTC, the phase uncertainty can be reduced from a DCO cycle to a single DTC step. For example, a DCO at 2.5 GHz has a DCO period of 400 ps, whereas the DTC step may be about 2.5 ps.

The implementation of (M+x) and (M−x) has a minimum step-size of 2, but adding a single delay step to one of the delay lines can reduce the step-size to 1, at the expense of (negligible) asymmetry.

The application of a differential DTC is not limited to fractional-N PLLs, and it can be applied to any structure where a pulse-like feedback is derived from a DCO, for example, in a phase selector feedback PLL or a sub-sampling PLL, as described below with reference to FIGS. 7 and 8, respectively.

Figure 7:
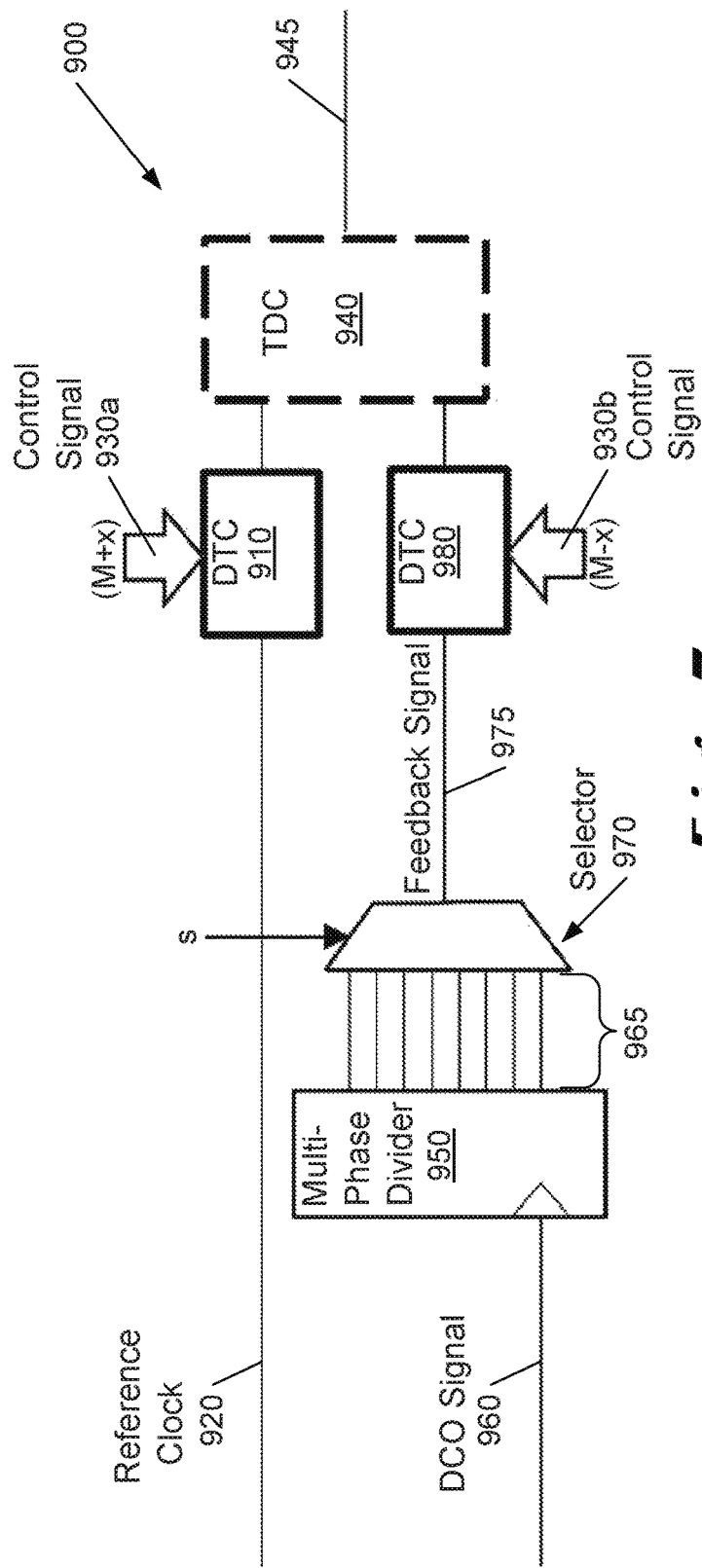
FIG. 7 illustrates a schematic block diagram of a phase selector implementation, according to an example embodiment.

FIG. 7 illustrates a phase selector feedback PLL implementation 900, according to an example embodiment, where only a portion of the PLL is shown for convenience. The phase selector feedback PLL implementation 900 includes, in a first path, a first DTC 910 that receives a reference clock signal 920 and adjusts it in accordance with a control signal 930a, for example, the (M+x) signal from the control module (not shown), and the output from the first DTC 910 forms a first input of a TDC 940. In a second path, a multi-phase divider 950 is configured for receiving a DCO signal 960 and for providing a plurality of signals 965 to a selector 970. A feedback signal 975 from the selector 970 is passed to a second DTC 980 where it is delayed in accordance with a control signal 930b, for example, the (M−x) signal from the control module (not shown), and the output from the second DTC 980 forms a second input of the TDC 940.

The TDC 940 provides an output signal 945 in accordance with the differential signals received from respective ones of the first and second DTCs 910, 980.

In line with the discussion above, the control module (not shown) providing the control signals 930a, 930b may include a sigma-delta module.

It will readily be appreciated that the first and second DTCs 910, 980 may correspond respectively to the first and second DTCs 780, 830 of FIG. 5.

Figure 8:
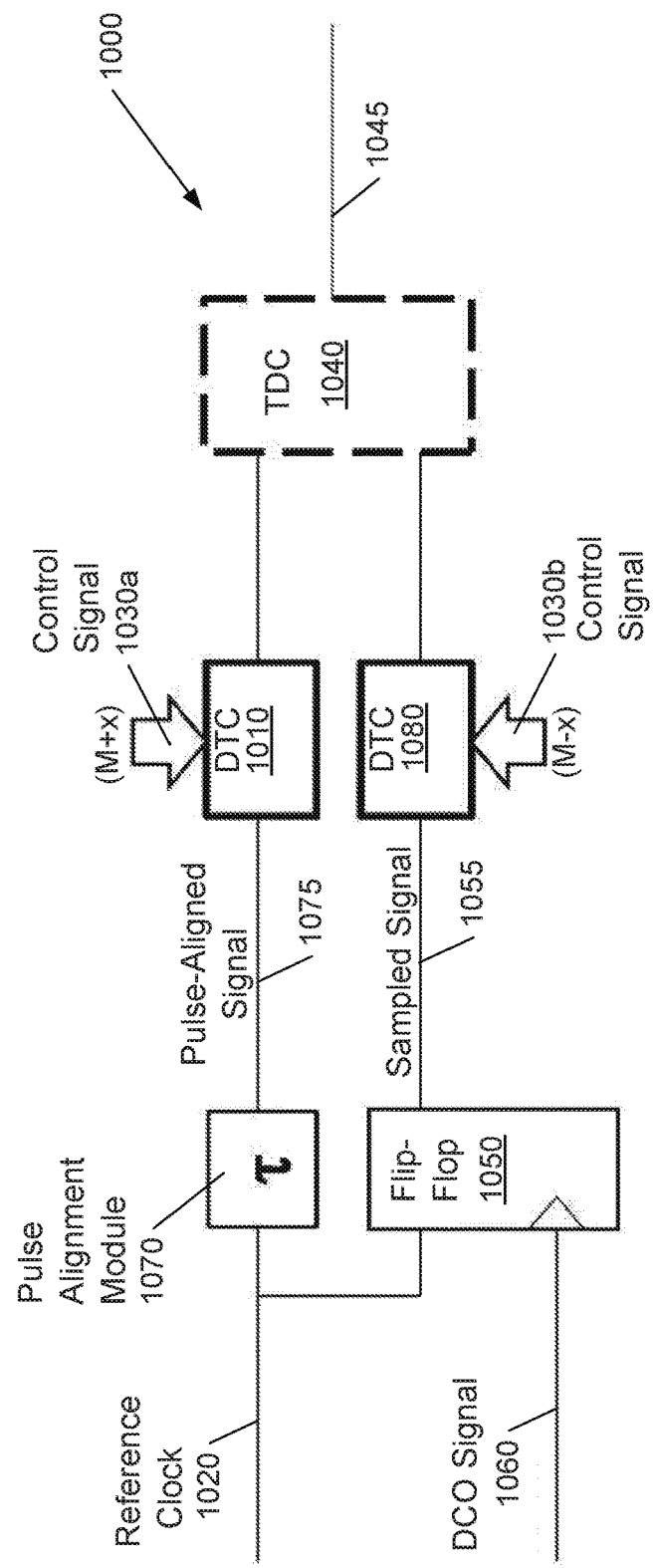
FIG. 8 illustrates a schematic block diagram of a sub-sampling implementation, according to an example embodiment.

FIG. 8 illustrates a sub-sampling PLL implementation 1000, according to an example embodiment, where only a portion of the PLL is shown for convenience. The sub-sampling PLL implementation 1000 includes, in a first path, a first DTC 1010 connected to receive a pulse-aligned signal 1075 from a pulse alignment module 1070. The input to the pulse alignment module 1070 is a reference clock signal 1020. A control signal 1030a, for example, a (M+x) signal from a control module (not shown), is used to adjust the pulse-aligned signal 1075 in the first DTC 1010, and the first DTC 1010 outputs a first input signal for a TDC 1040. In a second path, a flip-flop 1050 is configured to receive both a DCO signal 1060 and the reference signal 1020 and to provide an output sampled signal 1055, the flip-flop being configured as a sampler sampling the DCO signal 1060. The output sampled signal 1055 is adjusted by a control signal 1030b, for example, a (M−x) signal from the control module (not shown), in a second DTC 1080. The second DTC 1080 outputs a second input signal for the TDC 1040. The TDC 1040 provides an output 1045 based on the first and second input signals (differential input signals) supplied by the first and second DTCs 1010, 1080.

It will readily be appreciated that the first and second DTCs 1010, 1080 may correspond respectively to the first and second DTCs 780, 830 of FIG. 5 and/or the first and second DTCs 910, 980 of FIG. 7.

In line with the discussion above, the control module (not shown) providing the control signals 1030a, 1030b may include a sigma-delta module.

Although not illustrated, it will readily be appreciated that the high-frequency clock signals in FIGS. 7 and 8 can be generated in a similar or same way as described with reference to FIG. 5. Here, the phase selector (FIG. 7) and the sub-sampler (FIG. 8) each form part of the feedback loop.

The example embodiments described herein may provide various advantages including (i) reduced supply sensitivity, for instance, of the order of around 30 dB for gm-C implementations and around 25 dB for RC implementations; (ii) a more linear output due to the cancellation of even order terms; and (iii) a minimal increase in area overhead.

Although the present disclosure describes specific implementations for a PLL having a differential DTC, it will readily be understood that these implementations are not limiting and other implementations of a PLL having a differential DTC are possible.

What is claimed is:

1. A method comprising:
generating, by a clock module, a reference clock signal;
adjusting, by a first digital-to-time converter, the reference clock signal in accordance with a first control signal;
generating, by the first digital-to-time converter, a first input signal corresponding to the adjusted reference clock signal;
receiving, by a time-to-digital converter, the first input signal;
generating, by the time-to-digital converter, an output signal based on the first input signal;
generating an output high-frequency clock signal based on the output signal from the time-to-digital converter;
generating a derived signal from the output high-frequency clock signal;
adjusting, by a second digital-to-time converter, the derived signal in accordance with a second control signal, wherein a value of the first control signal and a value of the second control signal are centered about a midpoint value, M, and offset from the midpoint value by a fraction, x, such that the values of the first and second control signals are respectively defined as (M+x) and (M−x);
generating, by the second digital-to-time converter, a second input signal corresponding to the adjusted derived signal; and
receiving, by the time-to-digital converter, the second input signal, wherein the time-to-digital converter generates the output signal based on both the first input signal and the second input signal.

2. The method of claim 1, wherein the derived signal comprises a feedback signal in a phase-locked loop architecture.

3. The method of claim 2, further comprising:
generating a third control signal; and
using the third control signal to generate the feedback signal.

4. The method of claim 1, further comprising:
filtering the output signal from the time-to-digital converter to generate a filtered output signal, wherein generating the output high-frequency clock signal comprises using the filtered output signal to generate the output high-frequency clock signal.

5. The method of claim 1, wherein the derived signal comprises a phase selector output signal in a phase selector architecture.

6. The method of claim 1, wherein generating the derived signal comprises using a phase selector to select a phase signal of the output high-frequency clock signal as the derived signal.

7. The method of claim 6, wherein adjusting the derived signal in accordance with the second control signal comprises adjusting the selected phase signal in accordance with the second control signal.

8. The method of claim 1, wherein the derived signal comprises a sub-sampled output signal in a sub-sampler architecture.

9. The method of claim 1, wherein generating the derived signal comprises:
inputting both the reference signal and the output high-frequency clock signal to a sampler; and
using the sampler to generate, as the derived signal, a sampled signal based on the reference signal and the output high-frequency clock signal.

10. The method of claim 9, wherein adjusting the derived signal in accordance with the second control signal comprises adjusting the sampled signal in accordance with the second control signal.

11. A system comprising:
a first clock module configured to generate a reference clock signal;
a first digital-to-time converter configured to adjust the reference clock signal in accordance with a first control signal and to generate an adjusted reference clock output signal;
a time-to-digital converter configured to receive, as a first input signal, the adjusted reference clock output signal from the first digital-to-time converter;
a second clock module configured to generate an output high-frequency clock signal based on an output from the time-to-digital converter;
a feedback module configured to receive the output high-frequency clock signal and to generate a derived signal based on the output high-frequency clock signal;
a second digital-to-time converter configured to adjust the derived signal in accordance with a second control signal and to provide the adjusted derived signal, as a second input signal, to the time-to-digital converter; and
a control module configured to generate the first and second control signals, wherein a value of the first control signal and a value of the second control signal are centered about a midpoint value, M, and offset from the midpoint value by a fraction, x, such that the values of the first and second control signals are respectively defined as (M+x) and (M−x).

12. The system of claim 11, wherein the feedback module comprises a feedback loop of a phase-locked loop architecture, and the derived signal comprises a feedback signal.

13. The system claim 12, wherein the feedback loop comprises a fractional-N module configured for generating the feedback signal.

14. The system of claim 13, wherein the control module is further configured to generate a third control signal, and wherein the third control signal is applied to the fractional-N module to generate the feedback signal.

15. The system of claim 11, further comprising at least one filter configured to filter the output from the time-to-digital converter and to generate a filtered output signal, and wherein the second clock module is configured to use the filtered output signal to generate the output high-frequency clock signal.

16. The system of claim 11, wherein the feedback module comprises a phase selector, wherein the phase selector includes a multi-phase divider configured to select a phase signal as the derived signal, and wherein the second digital-to-time converter is configured to adjust the selected phase signal in accordance with the second control signal.

17. The system of claim 11, wherein the feedback module comprises a sub-sampler, wherein the sub-sampler includes a sampler configured to receive both the reference signal and the output high-frequency clock signal and to generate, as the derived signal, a sampled signal based on the reference signal and the output high-frequency clock signal, and wherein the second digital-to-time converter is configured to adjust the sampled signal in accordance with the second control signal.

18. The system of claim 11, wherein the control module comprises a sigma-delta module.

\* \* \* \* \*